(12) United States Patent
Nakadaira

(10) Patent No.: US 7,956,537 B2
(45) Date of Patent: Jun. 7, 2011

(54) DISPLAY DEVICE WITH COOPERATING GROOVE AND INSERT SEALING STRUCTURE AND MANUFACTURING METHOD THEREFOR

(75) Inventor: Tadakatsu Nakadaira, Kanagawa (JP)

(73) Assignee: Sony Corporation, Tokyo (JP)

( * ) Notice: Subject to any disclaimer, the term of this patent is extended or adjusted under 35 U.S.C. 154(b) by 319 days.

(21) Appl. No.: 12/099,909

(22) Filed: Apr. 9, 2008

(65) Prior Publication Data

US 2008/0252839 A1 Oct. 16, 2008

(30) Foreign Application Priority Data

Apr. 12, 2007 (JP) ................................ 2007-104420

(51) Int. Cl.
*H01J 17/00* (2006.01)
*H05B 33/00* (2006.01)
*H01S 3/08* (2006.01)
(52) U.S. Cl. ........ 313/512; 313/498; 313/501; 313/506; 313/507; 445/24; 445/25; 315/169.1
(58) Field of Classification Search ............ 313/495–512
See application file for complete search history.

(56) References Cited

U.S. PATENT DOCUMENTS

| | | | | |
|---|---|---|---|---|
| 2004/0217704 A1* | 11/2004 | Iwase et al. | ................... | 313/518 |
| 2004/0263740 A1* | 12/2004 | Sakakura et al. | ............. | 349/138 |
| 2005/0067953 A1* | 3/2005 | Yamazaki et al. | ............ | 313/506 |
| 2005/0189878 A1* | 9/2005 | Shitagami et al. | ............ | 313/512 |
| 2006/0033429 A1* | 2/2006 | Fujimura et al. | .............. | 313/509 |

FOREIGN PATENT DOCUMENTS

JP 2005-054111 3/2005

* cited by examiner

*Primary Examiner* — Nimeshkumar D Patel
*Assistant Examiner* — Tracie Green
(74) *Attorney, Agent, or Firm* — SNR Denton US LLP

(57) ABSTRACT

A display device includes: a support substrate including a display region where a plurality of display elements are arranged and a peripheral region where a drive circuit for each display element is provided in the periphery of the display region; a seal resin layer formed in at least the peripheral region; an opposed substrate bonded through the seal resin layer to the support substrate, sealing the display elements; an organic insulating film formed on the support substrate so as to insulate the drive circuit; a separation groove formed through the thickness of the organic insulating film so as to surround the display region and separate the organic insulating film into an inner portion and an outer portion; and a framelike projection formed on the opposed substrate so as to be opposed to the separation groove.

8 Claims, 6 Drawing Sheets

DISPLAY DEVICE WITH COOPERATING GROOVE AND INSERT SEALING STRUCTURE AND MANUFACTURING METHOD THEREFOR

CROSS REFERENCES TO RELATED APPLICATIONS

The present invention contains subject matter related to Japanese Patent Application JP 2007-104420 filed with the Japan Patent Office on Apr. 12, 2007, the entire contents of which being incorporated herein by reference.

BACKGROUND OF THE INVENTION

1. Field of the Invention

The present invention relates to a display device and a manufacturing method therefor, and more particularly to a display device having organic EL (electro Luminescent) elements and a manufacturing method for the display device.

2. Description of the Related Art

In recent years, a next-generation display has been actively developed in the field of a display device, wherein space saving, high luminance, low power consumption, etc. are demanded. As such a display device, an organic EL display using organic EL elements has now received attention. Such an organic EL display is of a self-luminous type, so that the viewing angle is wide and no backlight is demanded. Accordingly, this display has various features such that power saving can be expected, responsiveness can be increased, and the thickness of the device itself can be reduced.

Generally, in manufacturing an organic EL display, organic EL elements are formed on a drive substrate, and a sealing substrate is next bonded to the drive substrate so as to seal the organic EL elements, thereby obtaining a sealing structure such that the organic EL elements are isolated from the atmosphere. The reason for providing such a sealing structure is that the organic EL elements are very sensitive to moisture and oxygen, and if the organic EL elements are exposed to the atmosphere, there is a possibility that an unlumious area (dark spot) may be generated or the luminance may be reduced because of the moisture and oxygen contained in the atmosphere.

In particular, the organic EL display includes an interlayer insulating film formed so as to cover a drive circuit using a thin-film transistor, and the organic EL elements are arranged on the interlayer insulating film. In this case, an organic insulating film is used as the interlayer insulating film, which functions as a planarizing film for reducing the height of a step caused by the formation of the drive circuit to form the organic EL elements on a planarized surface. However, the interlayer insulating film formed of an organic material is less impermeable to moisture and oxygen, so that the moisture and oxygen remaining in the display device in the condition where they are deposited to foreign matter may be easily diffused through the interlayer insulating film.

FIG. 7 is a sectional view of a display device in the existing art. As shown in FIG. 7, the existing art display device includes a support substrate 10 having a display region 1A where a plurality of organic EL elements are arranged to form an EL layer 13 and a peripheral region 1B where a drive circuit for each organic EL element is provided in the periphery of the display region 1A, a seal resin layer 20 formed over the display region 1A and the peripheral region 1B, and an opposed substrate 30 bonded through the seal resin layer 20 to the support substrate 10, thereby sealing the organic EL elements. Further, a circuit forming layer 11 is formed on the support substrate 10, and an organic insulating film 12 is formed on the circuit forming layer 11. Further, a separation groove B is formed through the thickness of the organic insulating film 12 so as to surround the display region 1A (see Japanese Patent Laid-open No. 2006-54111, for example). Further, the EL layer 13 is formed on the organic insulating film 12 in the display region 1A, and an inorganic insulating film 14 is formed on the organic insulating film 12 so as to cover the EL layer 13 and the inner wall of the separation groove B.

Owing to the formation of the separation groove B through the thickness of the organic insulating film 12, it is possible to prevent that the moisture and oxygen remaining in the outer portion of the organic insulating film 12 outside of the separation groove B may pass through the organic insulating film 12 to enter the inner portion of the organic insulating film 12 inside of the separation groove B, thereby preventing a deterioration of the organic EL elements due to the diffusion of the moisture remaining in the display device.

SUMMARY OF THE INVENTION

In the existing art configuration that the separation groove B is formed through the thickness of the organic insulating film 12 formed over the support substrate 10, the deterioration of the organic EL elements due to the diffusion of the moisture remaining in the display device can be prevented as mentioned above. However, the sealability by the seal resin layer 20 is insufficient, so that it is difficult to prevent the entry of moisture and oxygen from the outside of a panel and to thereby reliably prevent the deterioration of the organic EL elements.

There is a need for providing a display device which can prevent the diffusion of moisture remaining in the display device and can also prevent the entry of moisture and oxygen from the outside of the panel.

There is another need for providing a manufacturing method for the display device. In accordance with an embodiment of the present invention, there is provided a display device including a support substrate having a display region where a plurality of display elements are arranged and a peripheral region where a drive circuit for each display element is provided in the periphery of the display region; a seal resin layer formed in at least the peripheral region. There is still provided a display device an opposed substrate bonded through the seal resin layer to the support substrate, thereby sealing the display elements; an organic insulating film formed on the support substrate so as to insulate the drive circuit; a separation groove formed through the thickness of the organic insulating film so as to surround the display region and separate the organic insulating film into an inner portion and an outer portion. There is still further provided a display device and a framelike projection formed on the opposed substrate so as to be opposed to the separation groove; the projection being inserted in the separation groove in the condition where the seal resin layer is interposed between the projection and the inner wall of the separation groove.

With this configuration, the seal resin layer in the peripheral region is interposed between the inner wall of the separation groove and the projection inserted in the separation groove, so that the sealability can be improved to thereby reliably prevent the entry of moisture and oxygen from the outside of the panel. Furthermore, since the separation groove is formed through the thickness of the organic insulating film, it is possible to prevent that the moisture remaining in the outer portion of the organic insulating film outside of the separation groove may pass through the organic insulating film to enter the inner portion of the organic insulating film inside of the separation groove. Accordingly, the diffusion of the moisture remaining in the display device can be prevented.

In accordance with another embodiment of the present invention, there is provided a manufacturing method for a display device including a support substrate including a display region where a plurality of display elements are arranged and a peripheral region where a drive circuit for each display element is provided in the periphery of the display region, a seal resin layer formed in at least the peripheral region, and an opposed substrate bonded through the seal resin layer to the support substrate, thereby sealing the display elements. The manufacturing method includes the steps of forming an organic insulating film on the support substrate so as to insulate the drive circuit; forming a separation groove through the thickness of the organic insulating film so as to surround the display region and separate the organic insulating film into an inner portion and an outer portion; forming the seal resin layer on the organic insulating film so as to fill the separation groove. The manufacturing method still includes forming a framelike projection on the opposed substrate so that the projection is opposed to the separation groove; and bonding the opposed substrate through the seal resin layer to the support substrate in the condition where the projection is inserted in the separation groove with the seal resin layer interposed between the projection and the inner wall of the separation groove.

According to this manufacturing method, the display device according to the present embodiments can be manufactured.

Thus, according to the present embodiments, it is possible to prevent the diffusion of moisture remaining in the display device and also reliably prevent the entry of moisture and oxygen from the outside of the panel, thereby realizing a high long-term reliability.

BRIEF DESCRIPTION OF THE DRAWINGS

Other features of the embodiments will be fully understood from the following detailed description and appended claims when taken with the accompanying drawings.

DETAILED DESCRIPTION OF THE PREFERRED EMBODIMENTS

Some preferred embodiments of the present invention will now be described in detail with reference to the drawings.

First Preferred Embodiment

Figure 1A:
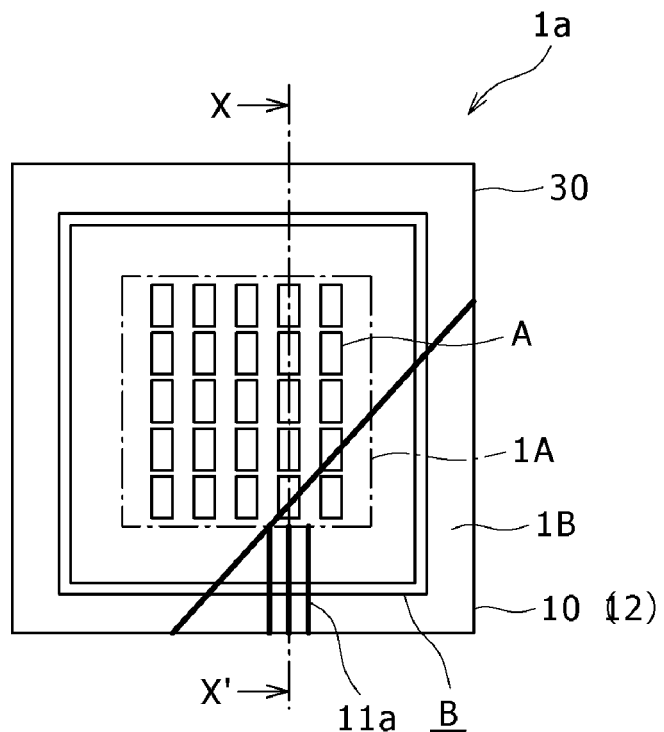
FIG. 1A is a partially cutaway, plan view of a display device according to a first preferred embodiments of the present invention.
Figure 1B:
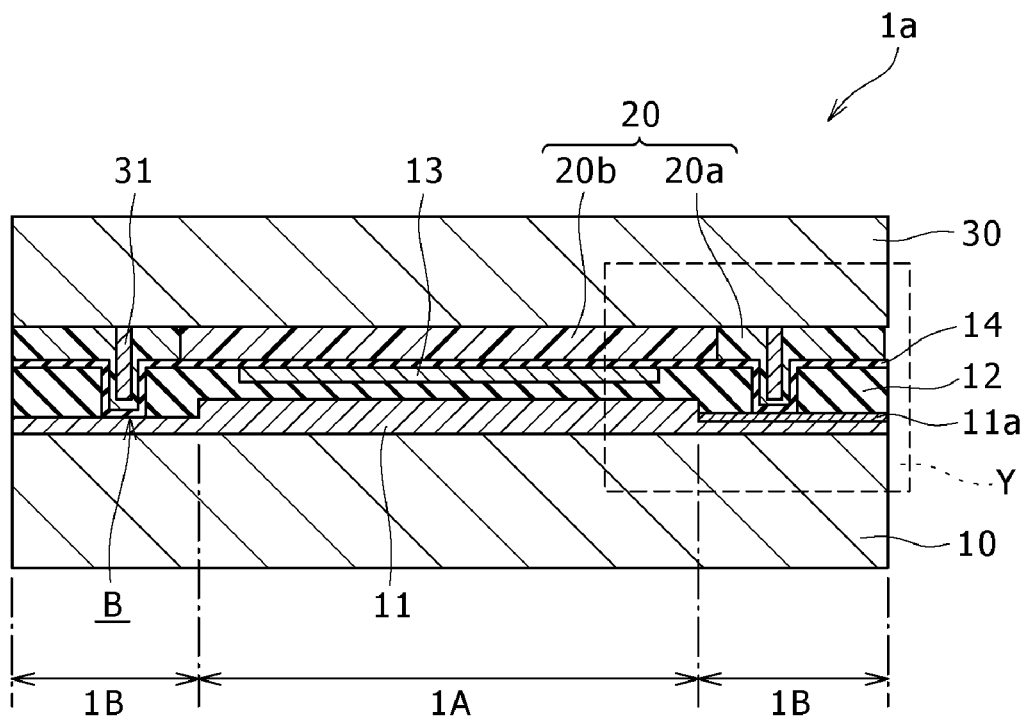
FIG. 1B is a cross section taken along the line X-X' in FIG. 1A.

FIG. 1A is a plan view of a display device 1a according to a first preferred embodiment of the present invention, and FIG. 1B is a schematic cross section taken along the line X-X' in FIG. 1A. In FIG. 1A, the components of the display device 1a are partially cut away for the purpose of illustration.

As shown in FIG. 1A, the display device 1a is an organic EL display using a plurality of organic EL elements A as light emitting elements. The display device 1a includes a support substrate 10 formed from a glass substrate or any other transparent substrates, a display region 1A formed above the support substrate 10 and including the organic EL elements A arranged in rows and columns, and a peripheral region 1B formed above the support substrate 10 so as to surround the display region 1A.

The display region 1A includes the organic EL elements A respectively formed at the pixels arranged in rows and columns above the support substrate 10. The display device 1a is of an active matrix type, for example, wherein each pixel has the organic EL element A and a pixel circuit (not shown) for driving this organic EL element A.

On the other hand, the peripheral region 1B includes a drive circuit (not shown) for transmitting a scan signal and a data signal to each organic EL element A. This drive circuit includes drive circuit wiring 11a, a part of which being shown in FIGS. 1A and 1B. Preferably, the drive circuit wiring 11a extends in a direction perpendicular to the longitudinal direction of a rectangular framelike sealing member (which will be hereinafter described) formed in the peripheral region 1B toward the outside of the sealing member. As will be hereinafter described, an organic insulating film and an inorganic insulating film are formed above the drive circuit wiring 11a, and the upper surfaces of the organic insulating film and the inorganic insulating film are projected because of the presence of the drive circuit wiring 11a. If this projection has a portion extending substantially parallel to the longitudinal direction of the sealing member, the proportion of this projecting portion to the transverse size of the sealing member along its width becomes large, causing a reduction in adhesion of the sealing member. As compared with such a case that the drive circuit wiring 11a is bent, it is possible to prevent the generation of a space under the sealing member due to the spring back of an opposed substrate 30 in bonding the opposed substrate 30 to the support substrate 10 according to this preferred embodiment. Furthermore, it is also possible to prevent the separation of the opposed substrate 30 due to a reduction in adhesion strength of the sealing member.

The layered structure of the display device 1a having the display region 1A and the peripheral region 1B mentioned above will now be described with reference to the cross section shown in FIG. 1B. A circuit forming layer 11 forming the pixel circuit in the display region 1A and the drive circuit in the peripheral region 1B is provided on the support substrate 10, and an organic insulating film 12 is provided on the circuit forming layer 11. An EL layer 13 forming the array of the organic EL elements A (see FIG. 1A) is provided on a central portion of the organic insulating film 12 in the display region 1A. An inorganic insulating film 14 is provided on the organic insulating film 12 so as to cover the EL layer 13. The opposed substrate 30 is provided above the support substrate 10 in such a manner that a seal resin layer 20 composed of a sealing member 20a and a filling member 20b is interposed between the inorganic insulating film 14 and the opposed substrate 30.

The components of the display device 1a will now be described in more detail with reference to FIG. 2, which is an enlarged view of a rectangular region Y shown in FIG. 1B.

Figure 2:
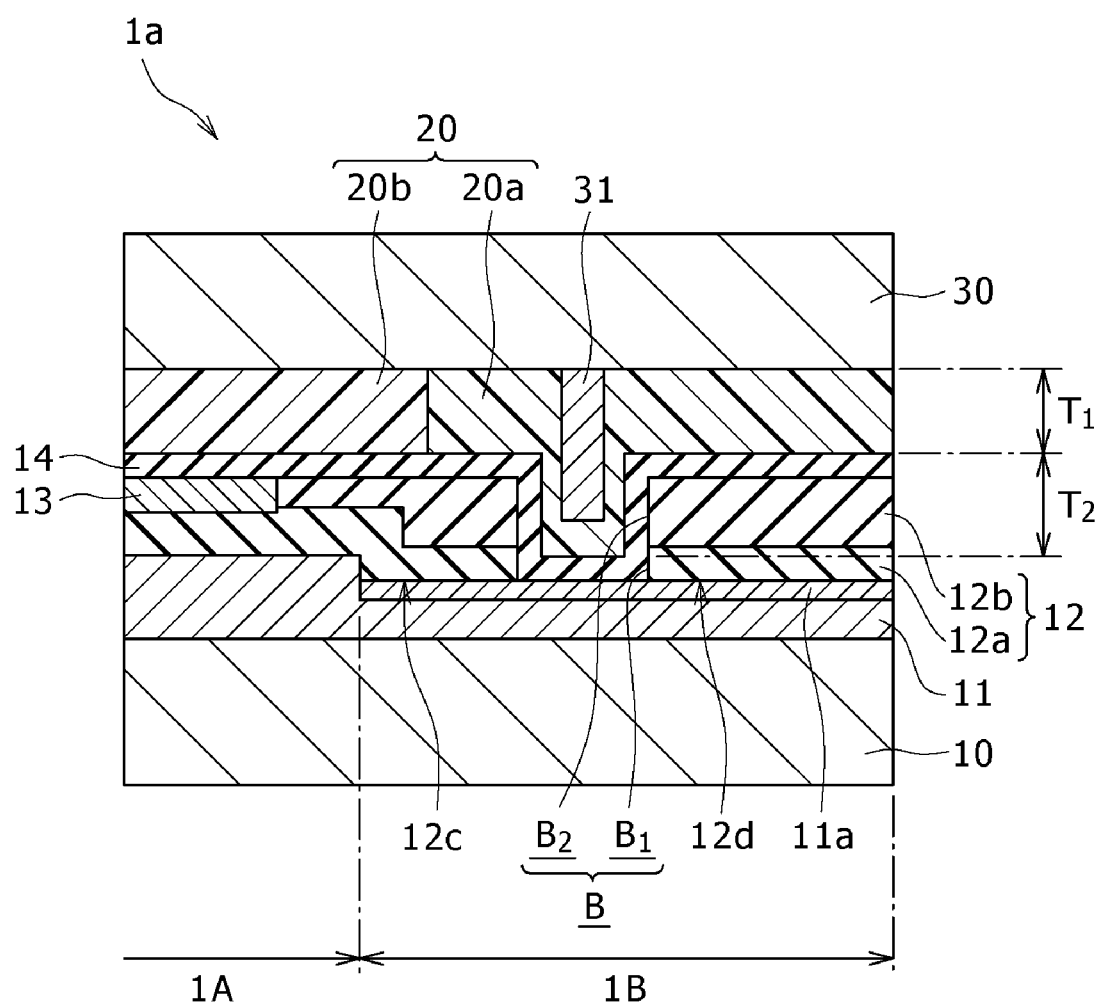
FIG. 2 is an enlarged sectional view of an essential part of the display device shown in FIG. 1B.

As shown in FIG. 2, the circuit forming layer 11 formed on the support substrate 10 has a step such that a portion of the circuit forming layer 11 in the display region 1A is higher in level than that in the peripheral region 1B because of the presence of the pixel circuit in the display region 1A. The surface of the circuit forming layer 11 is formed by an inorganic insulating film (not shown) such as a silicon oxide ($SiO_2$) film having impermeability to moisture and oxygen. Various wiring patterns inclusive of the drive circuit wiring 11a are formed on this inorganic insulating film of the circuit forming layer 11.

The organic insulating film 12 is formed over the support substrate 10 so as to fully cover the circuit forming layer 11. The organic insulating film 12 is composed of a first organic insulating film 12a and a second organic insulating film 12b formed on the first organic insulating film 12a. The organic insulating film 12 is formed with a rectangular framelike separation groove B for separating the organic insulating film 12 so as to surround the display region 1A. The separation groove B has a width of 0.1 mm or more and a depth of 1 to 100 μm.

The separation groove B is composed of a first separation groove B1 formed through the thickness of the first organic insulating film 12a and a second separation groove B2 formed through the thickness of the second organic insulating film 12b so as to be aligned with the first separation groove B1. Thus, the separation groove B is formed through the thickness of the organic insulating film 12 so as to entirely surround the periphery of the display region 1A. By the formation of the separation groove B through the thickness of the organic insulating film 12, it is possible to prevent the entry of moisture existing outside of the separation groove B through the inside of the organic insulating film 12, through the interface between the organic insulating film 12 and the inorganic insulating film 14, or through the interface between the organic insulating film 12 and the drive circuit wiring 11a into the display region 1A formed inside of the separation groove B. As a result, it is possible to prevent a deterioration of each organic EL element A (see FIG. 1A) due to the moisture present in the display region 1A.

Preferably, the height of the organic insulating film 12 in the display region 1A is equal to the height of the organic insulating film 12 in the peripheral region 1B. In particular, it is preferable that the height of an inner peripheral portion 12c of the organic insulating film 12 inside of the separation groove B around the peripheral edge of the display region 1A is equal to the height of an outer peripheral portion 12d of the organic insulating film 12 outside of the separation groove B and that the flatness of the organic insulating film 12 is less than or equal to 0.1 μm. Further, both the inner peripheral portion 12c and the outer peripheral portion 12d have a width of 0.1 mm or more. Thus, the height of the organic insulating film 12 is uniform over the display region 1A and the peripheral region 1B. Accordingly, in bonding the opposed substrate 30 through the seal resin layer 20 to the support substrate 10, it is possible to prevent the deflection of the opposed substrate 30 due to a difference in height of the organic insulating film 12.

The EL layer 13 having the array of the organic EL elements A (see FIG. 1A) is formed on the first organic insulating film 12a in the display region 1A. Each organic EL element A is composed of a lower electrode, an organic light emitting layer, and an upper electrode stacked in this order from the support substrate 10 side. The inorganic insulating film 14 such as a silicon nitride (SiNx) film is formed on the organic insulating film 12 so as to cover the EL layer 13 and the inner wall of the separation groove B. The inorganic insulating film 14 is more impermeable to moisture and oxygen than the organic insulating film 12, thus functioning to protect each organic EL element A from moisture and oxygen.

The support substrate 10 thus covered with the inorganic insulating film 14 is bonded through the seal resin layer 20 to the opposed substrate 30.

The seal resin layer 20 is composed of the rectangular framelike sealing member 20a formed in the peripheral region 1B and the rectangular filling member 20b formed inside of the sealing member 20a.

In this preferred embodiment, the sealing member 20a is formed of a liquid thermosetting resin so as to fill the separation groove B and cover the inorganic insulating film 14 in the peripheral region 1B. The material of the sealing member 20a has a low permeability to moisture and oxygen. Preferably, the sealing member 20a has a moisture permeability of 100 g/m, 24 h/100 μm or less at a temperature of 85° C. and a humidity of 85%. The sealing member 20a may contain an inorganic filler for reducing the moisture permeability, and a spacer for an adhesion improver, and controlling a film thickness.

The filling member 20b is also formed of a liquid thermosetting resin so as to cover the inorganic insulating film 14 in a region surrounded by the sealing member 20a. The resin of the filling member 20b has an adhesive property and an after-curing light transmittance of 80% or more. The filling member 20b may be formed of a UV (ultraviolet) curing resin or a heat/UV curing resin. Further, the resin of the filling member 20b may be in the state of a gel or a sheet.

While the seal resin layer 20 is composed of the sealing member 20a and the filling member 20b in this preferred embodiment, the seal resin layer 20 may be formed by a single member covering the entire surface of the inorganic insulating film 14 above the support substrate 10.

The opposed substrate 30 is opposed to the support substrate 10 with the seal resin layer 20 interposed therebetween. The opposed substrate 30 is formed of a transparent material such as glass capable of transmitting the light emitted from each organic EL element A. Although not shown, red, green, and blue color filters and a black matrix are provided on the opposed substrate 30, so as to take out the light emitted from each organic EL element A and to absorb the external light reflected from each organic EL element A, thus improving the contrast.

The characteristic configuration of the present embodiment is that a rectangular framelike projection 31 is provided on the opposed substrate 30 so as to be opposed to the separation groove B of the organic insulating film 12 on the support substrate 10. For example, the projection 31 is formed of a photosensitive resin.

The projection 31 has a width of 5 μm or more, for example, that can be obtained by a lithography technology. The projection 31 is inserted in the separation groove B whose inner wall is covered with the inorganic insulating film 14, and has a height greater than the thickness T1 of the seal resin layer 20 and smaller than the sum (T1+T2) of the thickness T1 and the depth T2 of the separation groove B whose inner wall is covered with the inorganic insulating film 14.

The opposed substrate 30 is opposed to the support substrate 10 with the seal resin layer 20 interposed therebetween in the condition where the projection 31 of the opposed substrate 30 is inserted in the separation groove B of the organic insulating film 12 on the support substrate 10. Accordingly, the sealing member 20a of the seal resin layer 20 is present between the covering the inner wall of the separation groove B and the projection 31 inserted in the separation groove B, thereby improving the sealability. As a result, it is possible to reliably prevent the entry of moisture and oxygen from the outside of the panel.

A manufacturing method for the display device 1a will now be described with reference to FIGS. 3A to 3F.

Figure 3A:
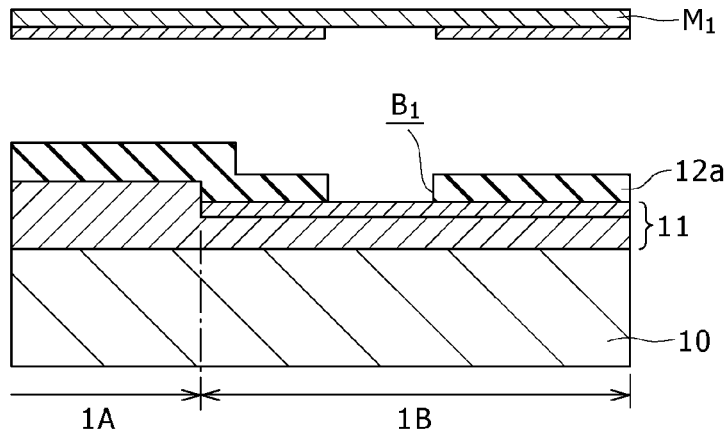
FIGS. 3A to 3F are sectional views for illustrating a manufacturing method for the display device shown in FIG. 1B.

As shown in FIG. 3A, the circuit forming layer 11 having the pixel circuit (not shown) in the display region 1A and the drive circuit (not shown) in the peripheral region 1B is formed on the support substrate 10. In this step, the inorganic insulating film (not shown) is formed on the surface of the circuit forming layer 11, and the drive circuit wiring 11a for leading the drive circuit to an external terminal is formed on this inorganic insulating film so as to extend in a direction perpendicular to the longitudinal direction of the sealing member 20a which will be formed later in the peripheral region 1B toward the outside of the sealing member 20. The circuit forming layer 11 has a step such that the display region 1A is higher in level than the peripheral region 1B.

Thereafter, the first organic insulating film 12a is formed from a positive type photosensitive resin on the entire surface of the circuit forming layer 11 by a spin coat method, for example. Thereafter, exposure is performed by using a photomask M1 and development is subsequently performed to thereby form the first separation groove B1 through the thickness of the first organic insulating film 12a so that the first separation groove B1 surrounds the display region 1A and reaches the circuit forming layer 11. Further, a contact hole (not shown) to be connected to a TFT in the circuit forming layer 11 is also formed through the thickness of the first organic insulating film 12a by this exposure. Thereafter, baking is performed in an atmosphere of inert gas such as nitrogen (N2) to thereby harden the first organic insulating film 12a and simultaneously remove the moisture contained in the first organic insulating film 12a. Thereafter, although not shown, a conductive layer is formed on the first organic insulating film 12a so as to fill the contact hole, and this conductive layer is next patterned to form the lower electrode (not shown) corresponding to each pixel on a portion of the first organic insulating film 12a in the display region 1A.

Figure 3B:
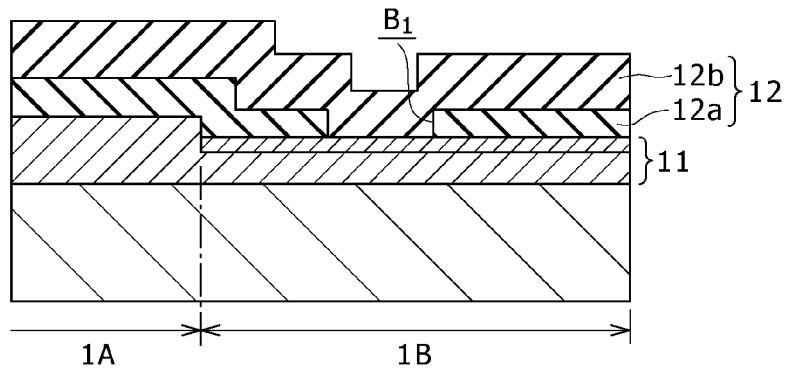

As shown in FIG. 3B, the second organic insulating film 12b is formed from a positive type photosensitive resin on the entire surface of the first organic insulating film 12a by a spin coat method, for example. As a result, the organic insulating film 12 composed of the first organic insulating film 12a and the second insulating film 12b layered on the first organic insulating film 12a is formed on the circuit forming layer 11. In this step, the first separation groove B1 is filled with the second organic insulating film 12b. The first and second organic insulating films 12a and 12b are formed as planarizing films, so that the step height of the circuit forming layer 11 is reduced to such an extent that the step following the surface shape of the circuit forming layer 11 is left.

Figure 3C:
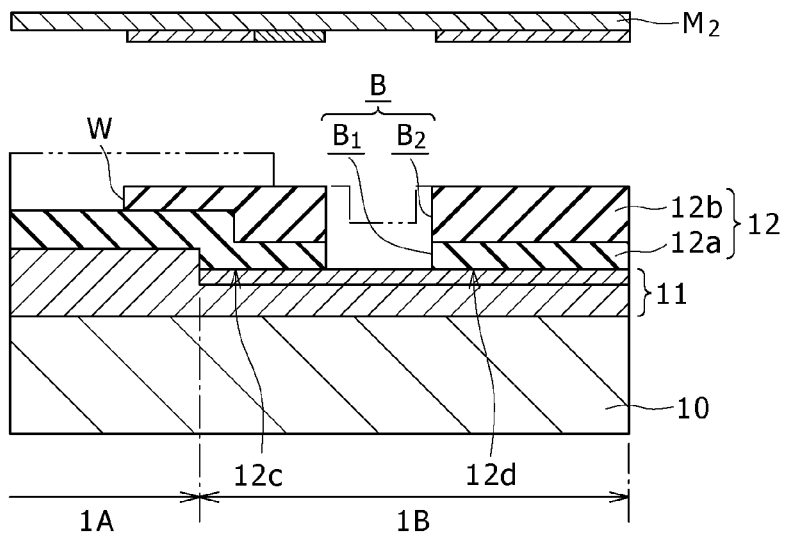

As shown in FIG. 3C, exposure is performed by using a photomask M2 and development is subsequently performed to thereby form a pixel opening W for forming each pixel, or each organic EL element in the display region 1A, so that the surface of each lower electrode (not shown) formed on the first organic insulating film 12a is exposed. At the same time, the second separation groove B2 is formed through the second organic insulating film 12b so as to be aligned with the first separation groove B1. In this step, a halftone mask is used as the photomask M2, and a portion of the organic insulating film 12 in the display region 1A except each pixel opening W which portion is higher in level than that in the peripheral region 1B is exposed with light in an amount less than that for the second separation groove B2 and each pixel opening W, thereby making the height of the organic insulating film 12 inside of the separation groove B equal to that outside of the separation groove B.

Thus, the height of the organic insulating film 12 is made uniform over the display region 1A and the peripheral region 1B by using a halftone mask as the photomask M2 to control the amount of exposure light. As a modification, a normal photomask may be used as the photomask M2 to first form the second separation groove B2 and each pixel opening W. Thereafter, this normal photomask is used again to partially remove the organic insulating film 12 in the display region 1A, thereby making the height of the organic insulating film 12 uniform over the display region 1A and the peripheral region 1B.

Thereafter, baking is performed in an atmosphere of inert gas such as nitrogen (N2) to thereby remove the moisture contained in the first and second organic insulating films 12a and 12b.

Figure 3D:
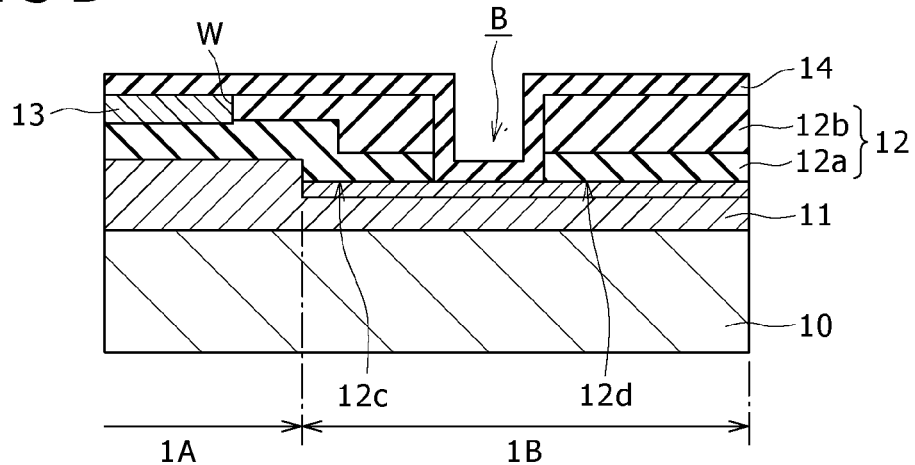

As shown in FIG. 3D, the organic light emitting layer (not shown) is formed on the lower electrode exposed to each pixel opening W, and the upper electrode is next formed on the organic light emitting layer so as to fully cover at least the display region 1A, thus forming the EL layer 13.

Thereafter, the inorganic insulating film 14 of SiNx is formed on the organic insulating film 12 so as to cover the EL layer 13 and the inner wall of the separation groove B by chemical vapor deposition (CVD) or sputtering.

Figure 3E:
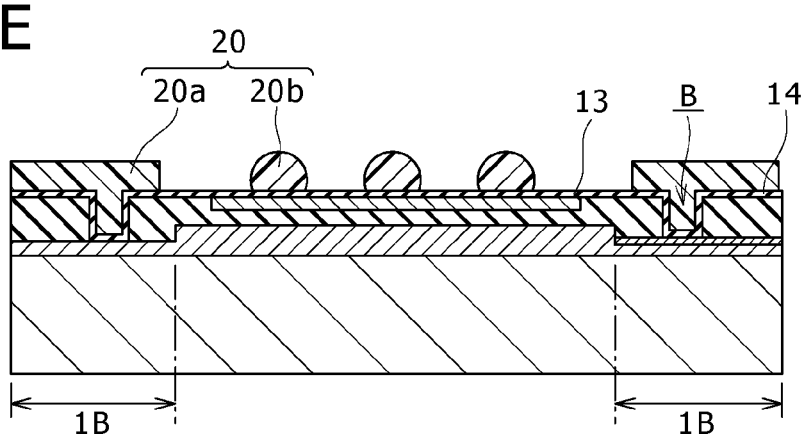

As shown in FIG. 3E, the seal resin layer 20 for bonding the opposed substrate 30 to the support substrate 10 is formed on the inorganic insulating film 14 in an atmosphere of inert gas. First, the sealing member 20a in the state of a liquid is formed on the inorganic insulating film 14 in the peripheral region 1B. In this step, the separation groove B whose inner wall is covered with the inorganic insulating film 14 is filled with the sealing member 20a.

Thereafter, the filling member 20b is applied onto the inorganic insulating film 14 surrounded by the sealing member 20a in an atmosphere of inert gas by using a dispenser or the like. The application of the filling member 20b is performed in the form of a dot or several dots if the area of the region surrounded by the sealing member 20a is large.

Thus, the formation of the seal resin layer 20 is performed preferably in an atmosphere of inert gas. However, the formation of the seal resin layer 20 may be performed in the atmospheric air within a short period of time after forming the EL layer 13. While the seal resin layer 20 is formed on the support substrate 10 side in this preferred embodiment, it may be formed on the opposed substrate 30 side.

Figure 3F:
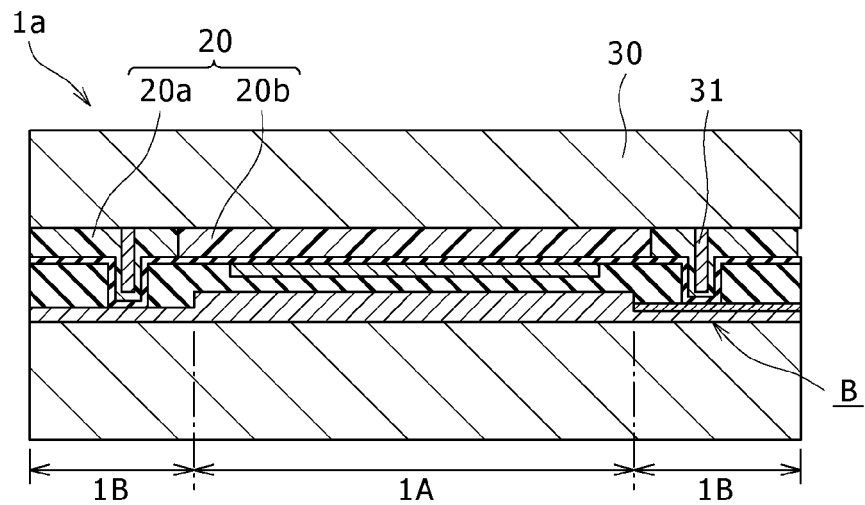

As shown in FIG. 3F, the projection 31 is formed on the opposed substrate 30 so as to be opposed to the separation groove B by applying a positive type photosensitive resin and performing exposure through a photomask (not shown) and subsequent development. Thereafter, baking is performed to harden the photosensitive resin. In the case of forming the projection 31 from an inorganic insulating material or a conductive material, an inorganic insulating film or a conductive film is formed on the opposed substrate 30, and etching using a resist pattern is next performed to thereby form the projection 31.

In a vacuum (20 Pa or less), the opposed substrate 30 is opposed to the support substrate 10 so that the projection 31 is inserted through the sealing member 20 into the separation groove B, and the opposed substrate 30 is bonded through the seal resin layer 20 to the support substrate 10. Before hardening the sealing member 20a and the filling member 20b, each organic EL element A and the corresponding color filter are aligned to each other in the condition where the opposed substrate 30 is bonded to the support substrate 10 in the vacuum. Thereafter, the assembly of the support substrate 10 and the exposed substrate 30 is opened to an atmospheric air or an atmosphere of inert gas. Since the height of the organic insulating film 12 is uniform, it is possible to prevent the generation of a space in the sealing member 20a due to the spring back of the opposed substrate 30. Accordingly, it is possible to prevent the separation of the opposed substrate 30 due to a reduction in adhesive strength of the sealing member 20a caused by the generation of such a space and to also prevent the entry of moisture and oxygen from the outside of the panel. Thereafter, the assembly of the support substrate 10 and the opposed substrate 30 is heated for a given time period to harden the sealing member 20a and the filling member 20b. The thickness of the seal resin layer 20 after bonding the opposed substrate 30 to the support substrate 10 is set to 25 μm or less, preferably 20 μm or less at the thickest portion. It is more preferable to more reduce the thickness of the seal resin layer 20. The alignment of each organic EL element A and the corresponding color filter may be performed before inserting the projection 31 into the separation groove B.

The manufacturing method for the single display device 1a has been described above. In actual, however, both the support substrate 10 and the opposed substrate 30 have a plurality of display device forming regions arranged, and a plurality of display devices are simultaneously formed in these forming regions. In this case, after bonding the opposed substrate 30 to the support substrate 10, the assembly of these substrates 10 and 30 is scribed to separate the plurality of display devices from each other.

Thus, the display device 1a is formed as an organic EL display.

According to the display device 1a and the manufacturing method therefor as mentioned above, the sealing member 20a of the seal resin layer 20 in the peripheral region 1B is present between the inner wall of the separation groove B and the projection 31 inserted in the separation groove B, thereby improving the sealability to reliably prevent the entry of moisture and oxygen from the outside of the panel. Further, by the formation of the separation groove B through the thickness of the organic insulating film 12, it is possible to prevent the entry of moisture existing outside of the separation groove B through the inside of the organic insulating film 12, through the interface between the organic insulating film 12 and the inorganic insulating film 14, or through the interface between the organic insulating film 12 and the drive circuit wiring 11a into the display region 1A formed inside of the separation groove B. As a result, the diffusion of moisture remaining in the display device 1a can be prevented to realize a high long-term reliability.

According to the display device 1a and the manufacturing method therefor as mentioned above, the height of the organic insulating film 12 is uniform over the display region 1A and the peripheral region 1B. Accordingly, in bonding the opposed substrate 30 through the seal resin layer 20 to the support substrate 10, the deflection of the opposed substrate 30 can be prevented. As a result, the spring back of the opposed substrate 30 due to such deflection can be avoided to thereby prevent the generation of a space in the sealing member 20a and to accordingly prevent the entry of moisture and oxygen due to this space.

While the sealing member 20a is formed of a liquid thermosetting resin in this preferred embodiment, the sealing member 20a may be formed of a resin in the state of a gel or a sheet. Further, the sealing member 20a may be formed of a UV (ultraviolet) curing resin or a heat/UV curing resin. In the case of using a resin sheet as the sealing member 20a, the film thickness of the sealing member 20a can be controlled more easily than in the case of using a gel resin or a liquid resin as the sealing member 20a.

For example, the sheet resin as the sealing member 20a may be provided by a sheet thermosetting resin preliminarily attached to a base film (release film). This sheet thermosetting resin is transferred to the inorganic insulating film 14 in the peripheral region 1B by means of a roll laminator, for example. In this transfer method, the transfer can be smoothly performed by setting the thickness of the sheet thermosetting resin to 10 to 30 μm.

(Modification)

In the step shown in FIG. 3E, a plurality of support columns may be additionally formed along the periphery of the seal resin layer 20.

Figure 4:
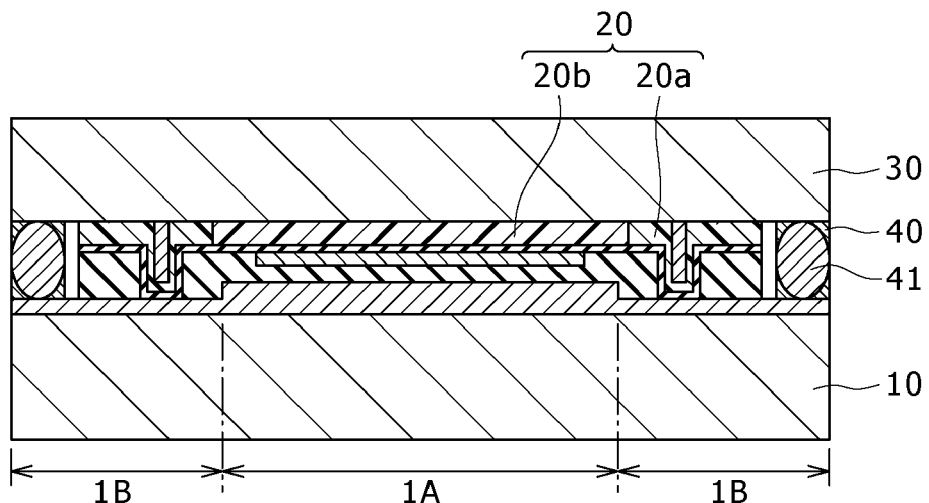
FIG. 4 is a sectional view showing a modification of the first preferred embodiment.

FIG. 4 shows such a modification of the first preferred embodiment. As shown in FIG. 4, a plurality of support columns 40 are formed in a region outside of the region for forming the sealing member 20a on the support substrate 10 where the drive circuit is not provided. Each support column 40 is formed of an organic material or an inorganic material and contains a spacer 41 having a size substantially equal to the gap between the support substrate 10 and the opposed substrate 30. Preferably, these support columns 40 may be located at least three positions to support the opposed substrate 30. By the formation of these support columns 40, it is possible to easily control the gap between the support substrate 10 and the opposed substrate 30. Accordingly, it is possible to reliably prevent the deflection of the opposed substrate 30 in bonding the opposed substrate 30 through the seal resin layer 20 to the support substrate 10. Alternatively, the support columns 40 may be formed on the opposed substrate 30 in a region opposed to the above-mentioned region on the support substrate 10.

In this modification using the support columns 40, it is not necessary to make the height of the organic insulating film 12 uniform over the display region 1A and the peripheral region 1B. However, it is preferable to make the height of the organic insulating film 12 uniform for the purpose of easy control of the gap between the support substrate 10 and the opposed substrate 30.

After bonding the opposed substrate 30 through the support columns 40 and the seal resin layer 20 to the support substrate 10, the assembly of these substrates 10 and 30 is scribed so that the support columns 40 are not left in the display device.

Second Preferred Embodiment

Figure 5:
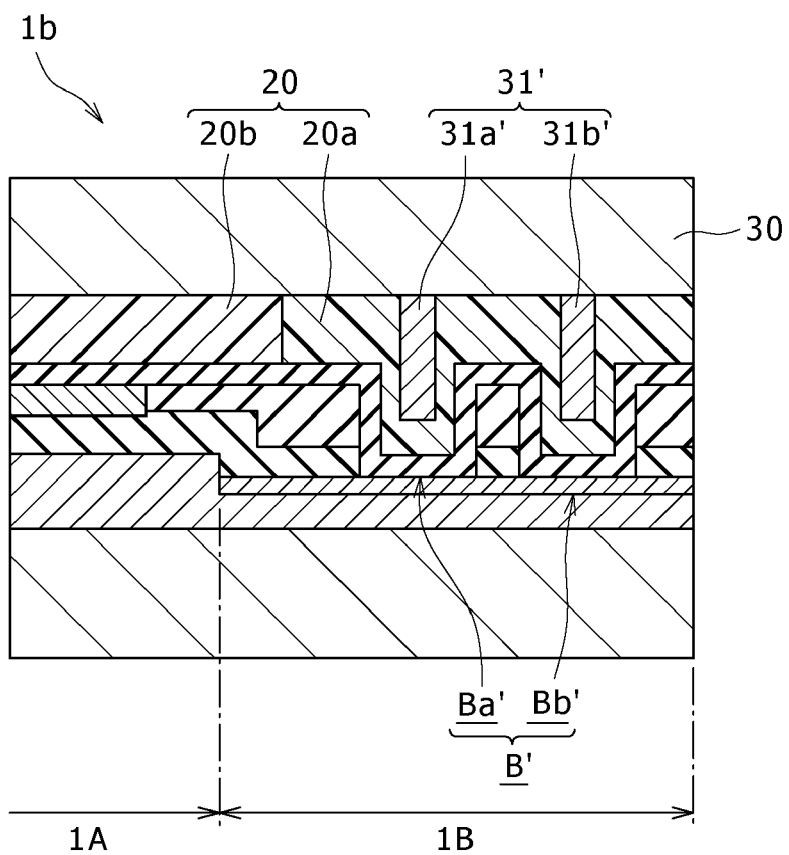
FIG. 5 is an enlarged sectional view of an essential part of a display device according to a second preferred embodiment of the present invention.

FIG. 5 is an enlarged sectional view of an essential part of a display device 1b according to a second preferred embodiment of the present invention. FIG. 5 is a view similar to FIG. 2 showing the region Y in FIG. 1B. The display device 1b according to the second preferred embodiment is different from the display device 1a according to the first preferred embodiment in the points that a plurality of separation grooves B' are formed through the organic insulating film 12 and that a plurality of projections 31' respectively corresponding to these separation grooves B' are formed on the opposed substrate 30. The other configuration is similar to that of the first preferred embodiment.

More specifically, the plural separation grooves B' are provided by two separation grooves Ba' and Bb' formed so as to surround the display region 1A in such a manner that the separation groove Bb' is formed outside of the separation groove Ba'. Further, the plural projections 31' are provided by two projections 31a' and 31b' respectively corresponding to the separation grooves Ba' and Bb'. The opposed substrate 30 is opposed to the support substrate 10 in the condition that the projections 31a' and 31b' are respectively inserted in the separation grooves Ba' and Bb' with the sealing member 20a interposed therebetween.

With this structure of the display device 1b, the sealing member 20a of the seal resin layer 20 in the peripheral region 1B is interposed between each separation groove B' and the corresponding projection 31', thereby further improving the sealability. Further, the diffusion of moisture remaining in the display device 1b can be prevented by the separation grooves B', thereby realizing a high long-term reliability.

While the separation grooves B' are provided by the two separation grooves Ba' and Bb' in this preferred embodiment, the separation grooves B' may be provided by three or more separation grooves. However, in the case that the separation grooves B' are provided by three or more separation grooves, the width of the peripheral region 1B must be increased, causing an increase in size. It is therefore preferable that the separation grooves B' are provided by two separation grooves.

Third Preferred Embodiment

Figure 6:
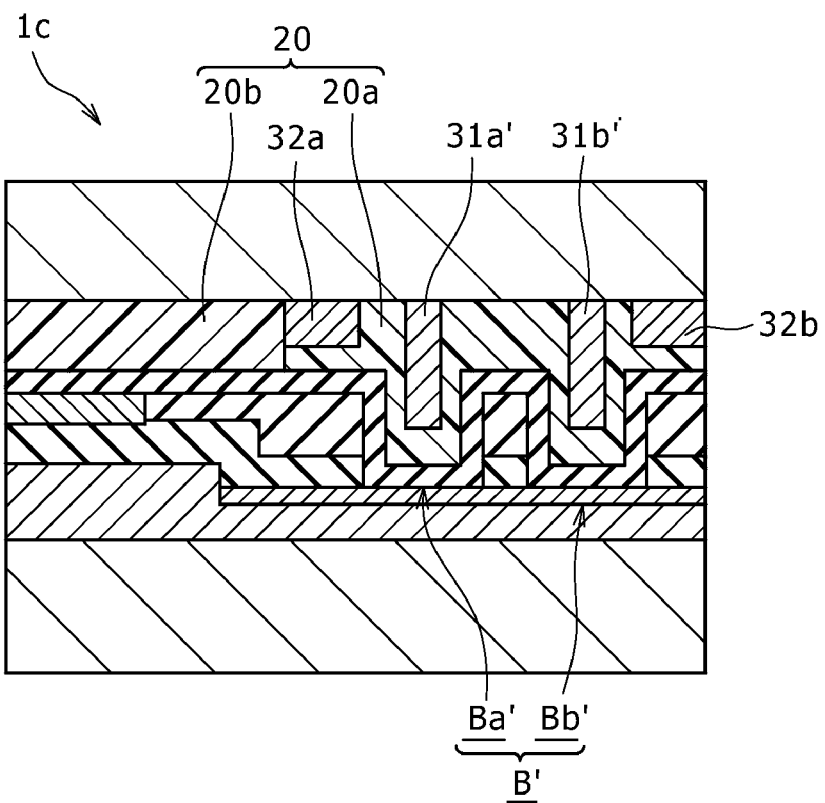
FIG. 6 is an enlarged sectional view of an essential part of a display device according to a third preferred embodiment of the present invention.
Figure 7:
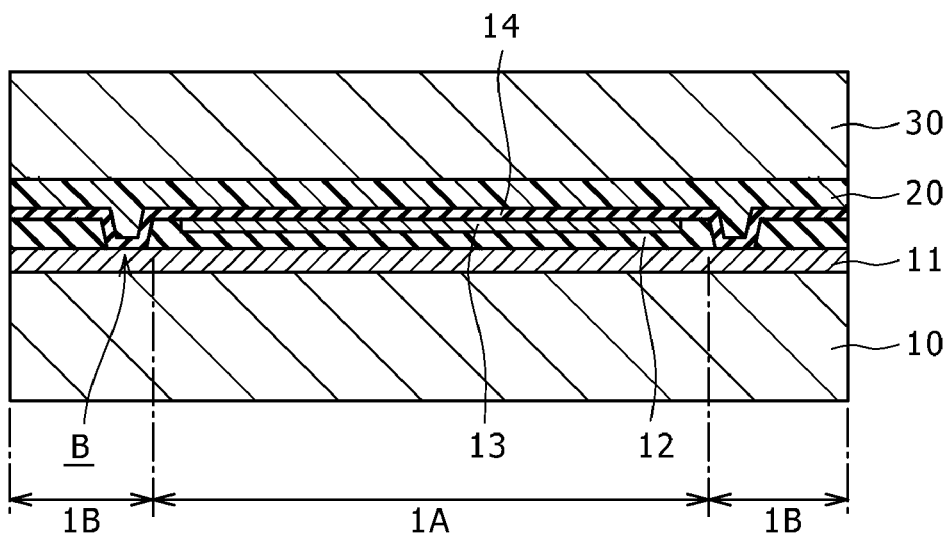
FIG. 7 is a sectional view of a display device in the existing art.

FIG. 6 is an enlarged sectional view of an essential part of a display device 1c according to a third preferred embodiment of the present invention. FIG. 6 is a view similar to FIG. 2 showing the region Y in FIG. 1B. The display device 1c according to the third preferred embodiment is different from the display device 1b according to the second preferred embodiment in the point that a plurality of additional projections 32 lower in height than the projections 31' are formed on the opposed substrate 30 at the positions outside and inside of the projections 31'. The other configuration is similar to that of the second preferred embodiment.

More specifically, the plural projections 32 are provided by two projections 32a and 32b formed respectively inside and outside of the projections 31a' and 31b'. These projections 32a and 32b are lower in height than the projections 31a' and 31b' and are opposed to the organic insulating film 12 in the peripheral region 1B. Thus, the projections 31' and 32 having different heights are formed on the opposed substrate 30, so that the sealing member 20a of the seal resin layer 20 in the peripheral region 1B is interposed between each separation groove B' and the corresponding projection 31' and between the organic insulating film 12 and each projection 32, thereby further improving the sealability. Particularly, in the case that the projections 31' and 32 are formed of a material having higher adhesion to the seal resin layer 20 than the material of the opposed substrate 30, the adhesion of the projections 31' and 32 to the seal resin layer 20 can be further improved.

In forming the projections 31' and 32 having different heights, the heights of the projections 31' and 32 can be controlled by using a halftone mask as the photomask to control the amount of exposure light after applying a positive type photosensitive resin to the opposed substrate 30. Alternatively, the exposure may be performed plural times by using a normal photomask to control the heights of the projections 31' and 32.

According to the third preferred embodiment, the sealability can be further improved by the formation of the projections 32a and 32b as compared with the second preferred embodiment.

The projections 32 used in the third preferred embodiment shown in FIG. 6 are applicable to the first preferred embodiment, and the support columns 40 used in the modification shown in FIG. 4 are applicable to the second and third preferred embodiments.

While the present embodiments are applied to an organic EL display in the first to third preferred embodiments and the modification mentioned above, the present embodiments are applicable also to a liquid crystal display.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a support substrate including (a) a display region where a plurality of display elements are arranged and (b) a peripheral region about a periphery of the display region and including a drive circuitry for said display elements;
   an opposed substrate;
   an organic insulating film over said support substrate so as to insulate said drive circuitry;
   a seal resin layer over the organic insulating film within at least the peripheral region;
   at least one separation groove within the peripheral region, said groove extending through the thickness of said organic insulating film and extending around said display region so as to surround said display region and separate said organic insulating film into an inner portion and an outer portion; and
   at least one first projection and at least one second projection both extending from said opposed substrate in a same direction within the peripheral region, the first and second projections being framelike projections, and the second projection being lower in height than said first projection with reference to the opposed substrate,
   wherein,
      said seal resin layer extends into said separation groove,
      said first projection is received within said separation groove with said seal resin layer between said first projection and inner walls and bottom of said separation groove, and said second projection is opposite said organic insulating film in a region outside the separation groove with said seal resin layer between said second projection and said organic insulating film, and
      said opposed substrate is bonded to said support substrate by means of said seal resin layer.

2. The display device according to claim 1, wherein said organic insulating film has a surface facing said opposed substrate which is uniformally planar over said display region and said peripheral region.

3. The display device according to claim 1, wherein said seal resin layer is composed of a sealing member in said peripheral region and a filling member surrounded by said sealing member.

4. The display device according to claim 3, wherein each of said sealing member and said filling member is formed of a sheet resin.

5. The display device according to claim 1, comprising a plurality of separation grooves formed through the thickness of said organic insulating film and arranged in said peripheral region, and a respective plurality of first projections formed on said opposed substrate corresponding to said plurality of separation grooves.

6. The display device of claim 1, wherein in a same direction, a thickness of said seal resin layer is T1, a depth of said separation groove is T2, and a length of said first projection is greater than T1 but less than T1+T2.

7. The display device of claim 1, further comprising an inorganic insulating film, said seal resin layer, and said organic insulating film, said inorganic insulating film covering said sidewalls and said bottom of said separation groove.

8. The display device of claim 7, wherein in a same direction, a thickness of said seal resin layer is T1, a depth of said separation groove is T2, and a length of said first projection is greater than T1 but less than T1+T2.

* * * * *